(12) United States Patent
Kim

(10) Patent No.: US 7,173,839 B2
(45) Date of Patent: Feb. 6, 2007

(54) LARGE SCALE INTEGRATED CIRCUIT AND AT SPEED TEST METHOD THEREOF

(75) Inventor: Young-Sik Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 117 days.

(21) Appl. No.: 11/096,137

(22) Filed: Mar. 31, 2005

(65) Prior Publication Data

US 2005/0276087 A1 Dec. 15, 2005

(30) Foreign Application Priority Data

Jun. 14, 2004 (KR) .................. 10-2004-0043646

(51) Int. Cl.
*G11C 29/06* (2006.01)
(52) U.S. Cl. .................. 365/49; 365/201; 711/113; 711/118
(58) Field of Classification Search .................. 365/49
See application file for complete search history.

(56) References Cited

U.S. PATENT DOCUMENTS

| | | | |
|---|---|---|---|
| 4,167,782 A * | 9/1979 | Joyce et al. ................ | 711/141 |
| 4,575,792 A * | 3/1986 | Keeley ........................ | 714/42 |
| 5,974,579 A | 10/1999 | Lepejian et al. | |
| 6,161,206 A * | 12/2000 | Wasson ....................... | 714/738 |
| 6,748,558 B1 * | 6/2004 | Gonzales et al. ............. | 714/47 |
| 2003/0120985 A1 * | 6/2003 | Slobodnik et al. .......... | 714/718 |
| 2005/0262401 A1 * | 11/2005 | Saitou ........................ | 714/42 |

FOREIGN PATENT DOCUMENTS

| | | |
|---|---|---|
| JP | 10177519 | 6/1998 |
| JP | 03139818 | 5/2003 |

* cited by examiner

*Primary Examiner*—Tan T. Nguyen
(74) *Attorney, Agent, or Firm*—F. Chau & Associates, LLC

(57) ABSTRACT

Disclosed are an apparatus and a method that at-speed-test a data cache included in a semiconductor integrated circuit by means of an on-chip memory having a size smaller than that of the data cache. A data cache has a first data storage area. An on-chip memory has a second data storage area smaller than the first data storage area, and stores test data. A address decoder decodes addresses so that the first data storage area is mapped to the second data storage area when an access for the test data stored in the on-chip memory is required.

26 Claims, 8 Drawing Sheets

LARGE SCALE INTEGRATED CIRCUIT AND AT SPEED TEST METHOD THEREOF

CROSS-REFERENCE TO RELATED APPLICATIONS

This U.S. non-provisional patent application claims priority under 35 U.S.C. § 119 of Korean Patent Application 2004-43646 filed on Jun. 14, 2004, the entire contents of which are hereby incorporated by reference.

BACKGROUND OF THE INVENTION

The present invention relates to testing a semiconductor integrated circuit, and, more particularly, to an at speed test apparatus and method for a data cache included in the semiconductor integrated circuit.

As semiconductor processes have developed, system on chip (SOC) devices, in which a Central Processing Unit (CPU) and a cache memory are integrated into a single chip, have improved. Upon integrating the CPU and the cache memory by means of the single chip, data input/output speed may be improved, thereby also improving the entire performance in the CPU. However, the semiconductor integrated circuit can be defective due to a fluctuation of a manufacturing process. To detect such defects, an at speed test, which performs testing conforming to a real operation speed of the semiconductor integrated circuit, is widely used.

Operation frequency of a tester for an at speed test having about 80 MHz has been widely used. Operation frequency of the semiconductor integrated circuit may range from 100 MHz to 1 GHz. A high speed tester of an operation frequency higher than 300 MHz is suggested but may be very expensive. Even if the high speed tester is used, the operation frequency of the high speed tester may be affected by parasitic capacitance between pins or existing between a plurality of external pins, namely, external terminals for connecting the semiconductor integrated circuit to the high speed tester.

To solve such problems, the semiconductor integrated circuit may perform a high speed test and transfer the high speed test results to a low speed tester for confirmation using a high speed internal on-chip phase-locked loop (PLL) clock. Test patterns can be stored in an off-chip memory, which may be located outside of the semiconductor integrated circuit, or an on-chip memory, which may be located inside of the semiconductor integrated circuit. To perform the at speed test without deteriorating performance of a system, it is generally preferred to use the on-chip memory rather than the off-chip memory.

An exemplary technique of performing an at speed test by a tester inside an integrated circuit by itself using test patterns previously stored in an on-chip memory and transferring the testing performance results to an external low speed tester is disclosed in Japanese Patent Laid-Open Publication No. 2003-139818. To sufficiently test an operation of an area in front of a data cache in the testing method, an on-chip memory having a size larger than that of the data cache should be mounted in the integrated circuit. This causes a size of the semiconductor integrated circuit to increase and the integration density to decrease.

SUMMARY OF THE INVENTION

The present invention is directed to an apparatus and a method that at-speed-test a data cache included in a semiconductor integrated circuit by means of an on-chip memory having a size smaller than that of the data cache.

An aspect of the present invention is to provide a semiconductor integrated circuit comprising: a data cache having a first data storage area; an on-chip memory having a second data storage area smaller than the first data storage area, the on-chip memory for storing test data; and an address decoder for decoding addresses so that the first data storage area is mapped to the second data storage area when an access for the test data stored in the on-chip memory is required.

According to a further aspect of the present invention, there is provided an at speed test system comprising: a semiconductor integrated circuit for decoding addresses so that a data storage area of a data cache is mapped to an on-chip memory having a data storage area smaller than the data storage area of the data cache, and for performing a read-miss operation, a line-fill operation, and a cast out operation for the decoded addresses of the data cache using test data stored in the on-chip memory; and a test circuit for receiving operation execution results of the data cache from an outside of the semiconductor integrated circuit, and for testing whether the data cache is defective based on the received operation execution results of the data cache.

According to a further aspect of the present invention, there is provided a method for at speed testing a data cache using an on-chip memory of a semiconductor integrated circuit, the method comprising the steps of: (a) decoding an address area of the data cache to an address area of the on-chip memory smaller than the address area of the data cache; and (b) reading test data from the on-chip memory in response to the decoded address area and testing a read-miss, a write-miss, a line fill, and a cast out of the data cache.

According to another aspect of the present invention, there is provided a method for at-speed-testing a data cache using an on-chip memory of a semiconductor integrated circuit, the method comprising the steps of: (a) decoding an address area of the data cache to an address area of the on-chip memory smaller than the address area of the data cache; (b) reading test data from the on-chip memory in response to the decoded address area, executing read-miss, write-miss, line fill, and cast out operations of the data cache, and outputting the executed results to an external tester of the semiconductor integrated circuit; and (c) analyzing operation execution results of the data cache by the tester and determining whether the data cache is defective.

Preferably, the address decoder decodes addresses so that 2N (where, N is an integer number) addresses are mapped to the second data storage area of the on-chip memory when the data cache has the first data storage area corresponding to N addresses. More preferably, the address decoder assigns at least one bit among address bits of the data cache to don't care address bits that do not influence the address decoding. Most preferably, the address decoder assigns n+1 bits to the don't care address bits when the data cache has $2^n$ sets, each of the $2^n$ sets has $2^s$ blocks, one cache block size is $2^b$ bytes, an entire cache size is $2^{(s+b+n)}$, and the on-chip memory has an address area of $2^{(s+b)}$ bytes corresponding to a single set size.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention will be described in conjunction with the accompanying drawings.

A large scale integrated circuit with a data cache and at speed test method thereof decodes a plurality of addresses of the data cache without regard for predetermined bits to map the addresses of the data cache to one address of an on-chip memory for every predetermined address. By using decoded addresses, a read-miss of N times, a write-miss of N times, a line-fill of N times, and a cast out of N times for N different addresses of the data cache are all tested. As a result, an at speed test for the data cache is sufficiently performed by an on-chip memory smaller than the data cache.

Figure 1:
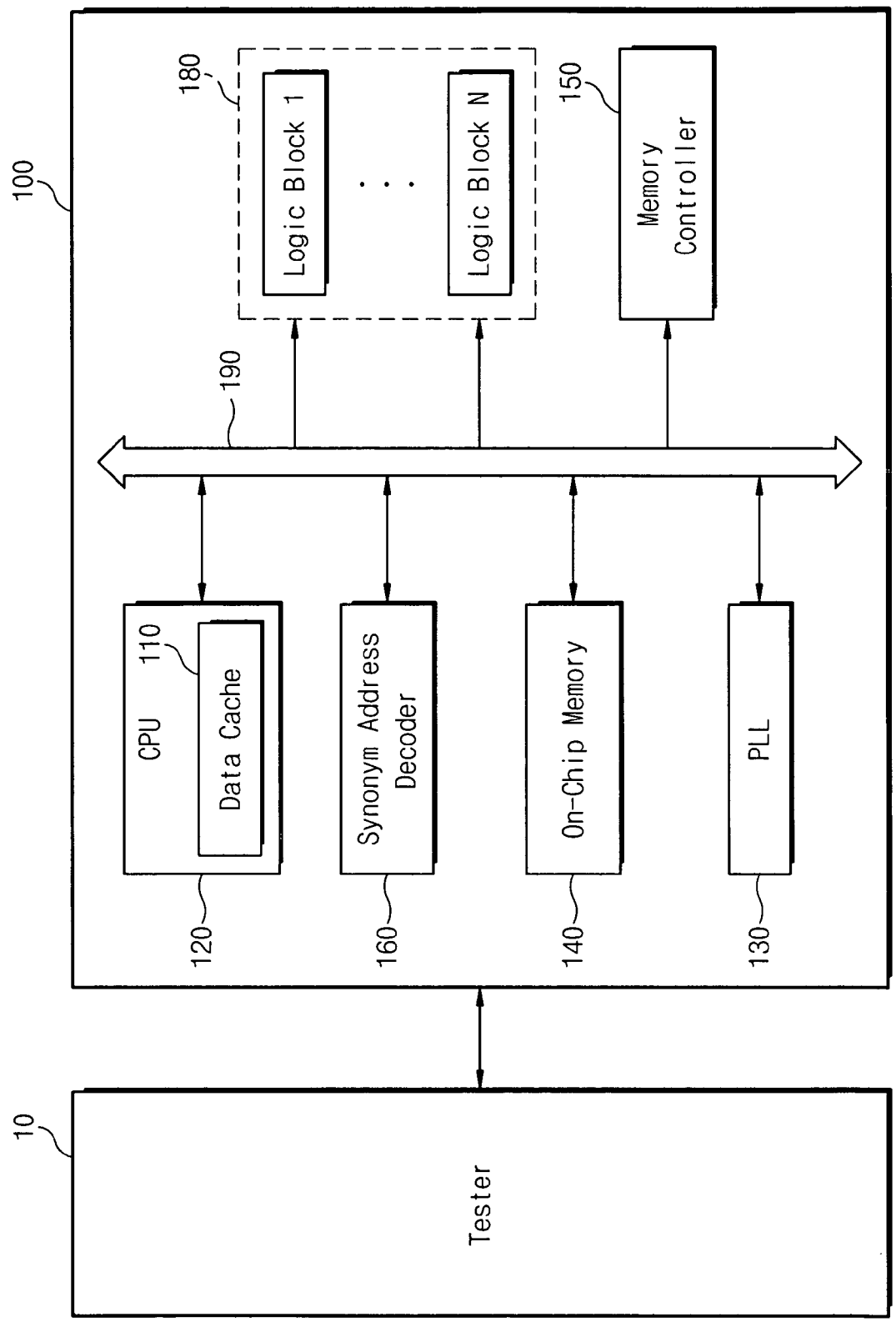
FIG. 1 is a block diagram showing a construction of a semiconductor integrated circuit according to an embodiment of the present invention.

FIG. 1 is a block diagram showing a construction of a semiconductor integrated circuit 100 according to an embodiment of the present invention. FIG. 1 shows the connecting relationship between a tester 10 and the semiconductor integrated circuit 100. Referring to FIG. 1, the semiconductor integrated circuit 100 according to the present invention includes a Central Processing Unit (CPU) 120 having a data cache 110, a Phase Locked Loop (PLL) 130, an on-chip memory 140, a memory controller 150, a synonym address decoder 160, a plurality of logic blocks 180, and a bus 190: The PLL 130 generates high speed clock signals necessary to operate the semiconductor integrated circuit 100. The on-chip memory 140 is mounted in the semiconductor integrated circuit 100. The memory controller 150 controls input and output operations of the on-chip memory 140. The synonym address decoder 160 decodes a synonym address so that the on-chip memory 140, which is smaller than the data cache 110, sufficiently tests all the functions of the data cache 100. The bus 190 transfers signals and data between the CPU 120, the PLL 130, the on-chip memory 140, the memory controller 150, the synonym address decoder 160 and the plurality of logic blocks 180 in the semiconductor integrated circuit 100.

In one exemplary embodiment of the present invention, the semiconductor integrated circuit 100 is a system on chip (SOC), which includes the CPU 120 with a cache memory operating at a frequency of several hundred MHz and the memory controller 150 operating at a frequency higher than 100 MHz. A critical timing path of a high speed SOC includes a cache line fill and a victim cast out. There are various problems in the characteristics of Input Output (IO) to perform an at speed test by directly applying clock signals to the critical timing path. A conventional at speed test method for the SOC is performed by applying clock signals of several hundred MHz from the external tester 10 to the semiconductor integrated circuit 100. In contrast, the SOC, as described herein, is tested by using high speed clock signals generated by the internal PLL 130. The SOC is tested using the synonym address decoded by the synonym decoder 160 so that the test can be performed by the on-chip memory 140 having a size smaller than that of the data cache 110. That is, the CPU 120 reads test data stored in the on-chip memory 140 during a cache-miss, and executes a read-miss operation N times, a write-miss operation N times, a line fill operation N times, and a cast out operation N times for N different addresses of the data cache 110. The execution results are transferred to the tester 10 connected outside of the semiconductor integrated circuit 100. The tester 10 judges the execution results from the semiconductor integrated circuit 100 and outputs testing results. The semiconductor integrated circuit 100 can be sufficiently tested by using the on-chip memory 140 smaller than the data cache 110.

Generally, the performance of the semiconductor integrated circuit 100 is determined by the longest path among all possible signal propagation paths therein. Thus, this longest path may be called a critical timing path or a threshold path. To understand the critical timing path of the semiconductor integrated circuit shown in FIG. 1 namely, a cache line fill and a victim case out of the data cache 110, a basic arrangement of the data cache 110 will be given below.

Upon analyzing a program, there may be a tendency that currently written data or commands are re-accessed. This tendency is referred to as a locality of reference. Locality of reference is widely used in program loops and sub-loops in a computer program. It is well understood that commands may be sequentially accessed prior to meeting a branch command. Such frequently accessed data and commands are typically stored in a cache memory. The CPU reads the desired data from the cache memory when the desired data exist in the cache memory; otherwise, the CPU accesses a main memory. When the data and commands that the CPU requests are found in the cache memory, a cache hit occurs. In contrast, when the data and commands that the CPU requests are not found in the cache memory, a cache miss occurs. When the cache hit occurs, the CPU operates without a waiting time. However, when the cache miss occurs, the CPU accesses the memory and accesses the data and commands stored therein, causing the occurrence of time delay.

A main object of the cache memory is to reduce the time to search necessary data therefrom. Transferring data from the main memory to the cache memory is called a mapping process. A cache may be classified as a fully associative cache, a Direct mapped cache, and an N-way set-associative cache according to the kinds the mapping processes.

Figure 2:
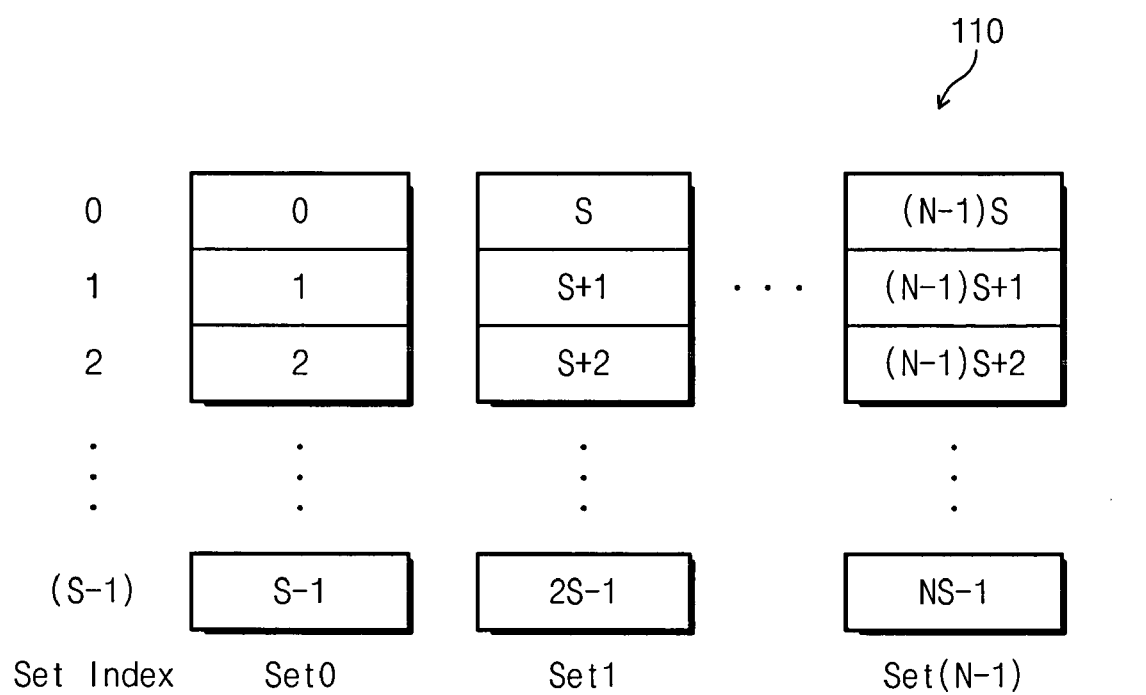
FIG. 2 is a view showing a construction of a data cache shown in FIG. 1.

FIG. 2 is a view showing a construction of a data cache 110 shown in FIG. 1, and shows a logic structure of an N-way set associative data cache.

The N-way set associative data cache binds blocks to be mapped to one entropy in the cache memory by one set. For example, two blocks having the same block index may be stored in a 2-way set associative data cache. The N-way set associative data cache has the advantage of having a miss rate lower than that of the directly mapped cache. The directly mapped cache may be a 1-way set associative data cache.

Referring to FIG. 2, the data cache 110 is an N-way set associative data cache having $2^n$ sets. Each of the $2^n$ sets has $2^s$ blocks, one cache block size is $2^b$ bytes, and an entire cache size is $2^{(s+b+n)}$. For example, an ARM1020E of ARM corporation has data 32 Kbytes ($=2^{15}=2^{(s+b+n)}=2^{(4+5+6)}$) and is composed of 64-way set associative, 32 bytes block structure. Accordingly, parameters for the ARM1020E of ARM corporation are as follows: N=64, n=6 (since 64=$2^n$, n=6), S=16, s=4 (since 16=$2^s$, n=4), b=5 (since 32=$2^b$, b=5). A detailed description of the ARM1020E of ARM corporation is disclosed in "ARM1020E Technical Reference Manual" issued by the ARM corporation.

Figure 3:
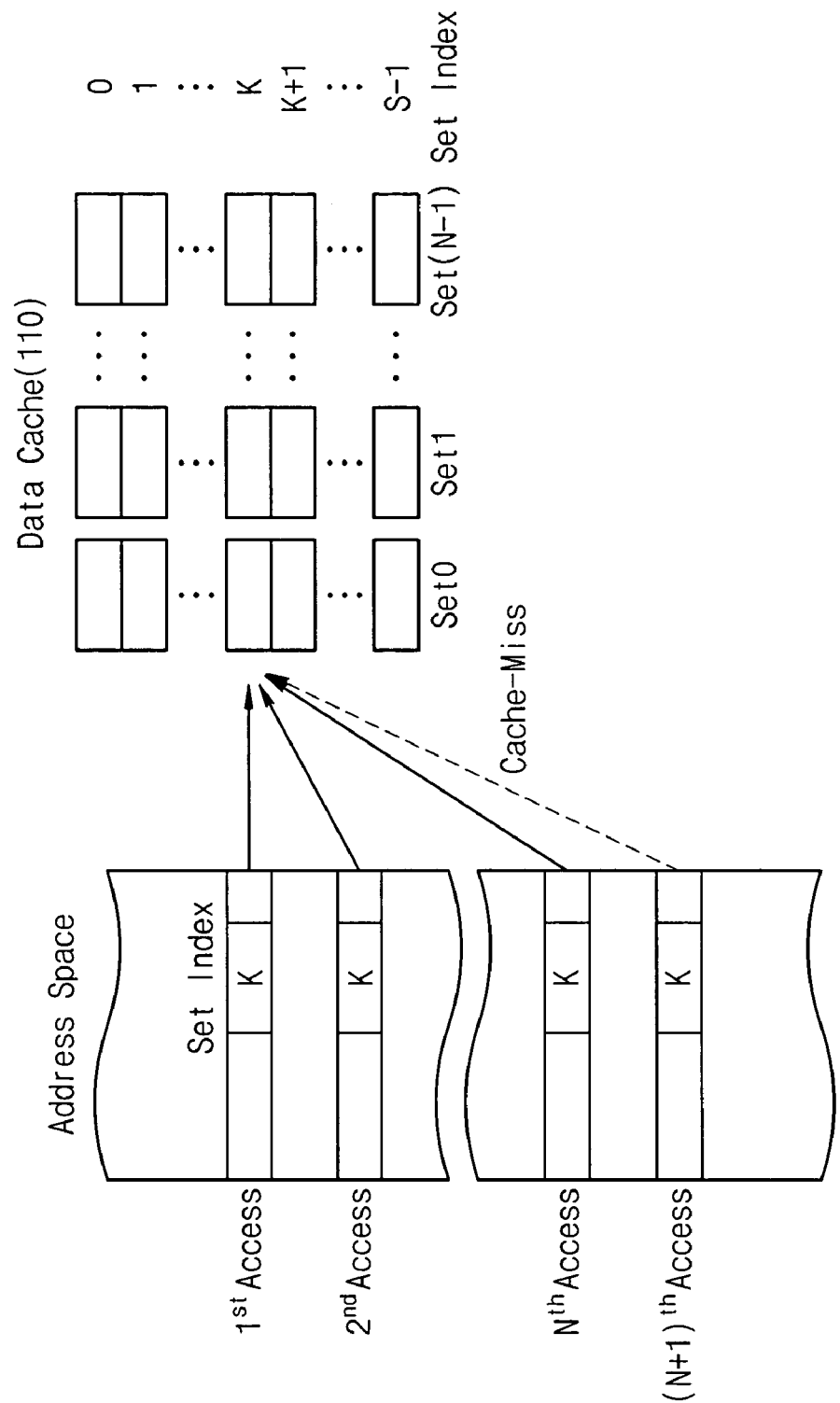
FIG. 3 is a view showing an example of a cache miss occurrence of the data cache structure shown in FIG. 2.

FIG. 3 is a view showing an example of a cache miss occurrence of the data cache structure shown in FIG. 2. With reference to FIG. 3, it is understood that accessing N+1 data having the same set index K and different addresses causes a data cache miss. For example, in the case of the ARM1020E data cache, when the CPU accesses 65 different address data having the same address [8:5], a data cache miss occurs. As described in greater detail below, the present invention decodes a synonym address and performs testing using the decoded synonym address when a cache-miss occurs.

Figure 4:
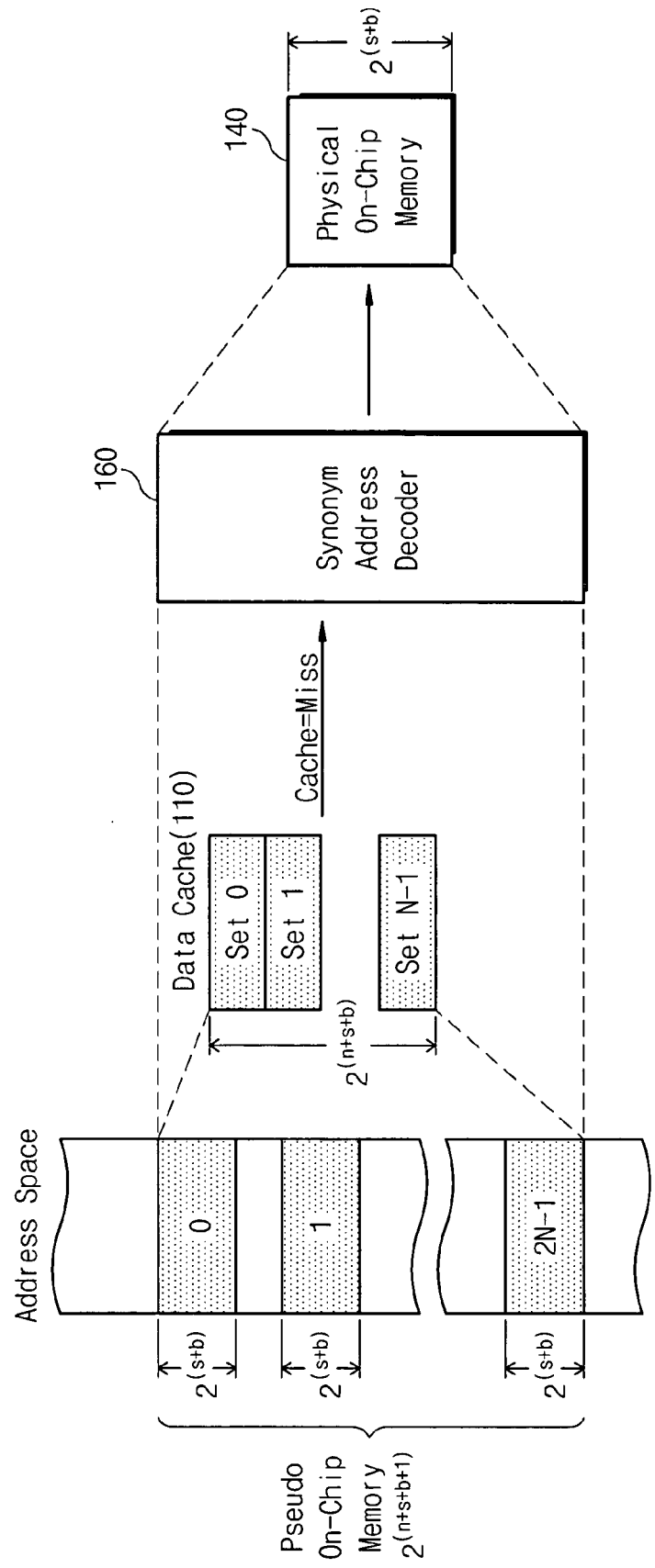
FIGS. 4 and 5 are views showing address decoding operations of a synonym address decoder shown in FIG. 1.
Figure 5:
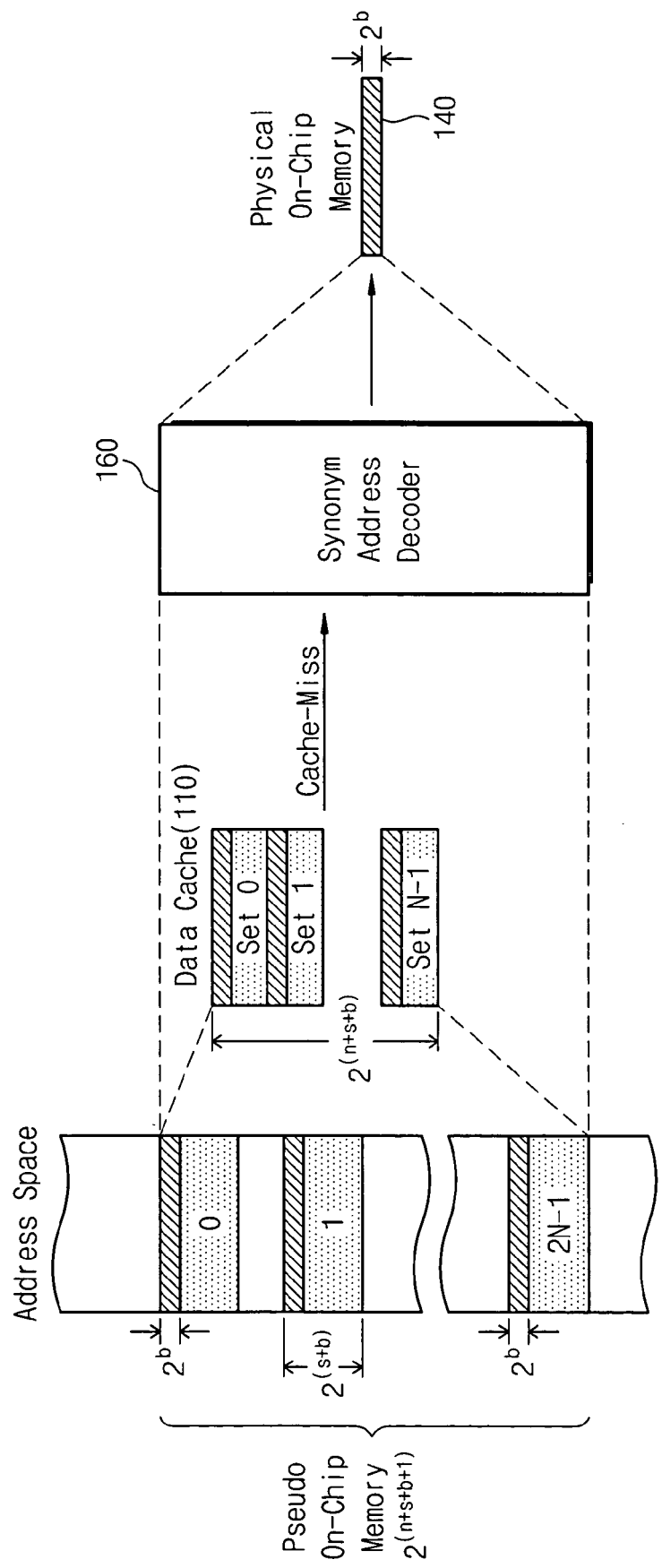

FIGS. 4 and 5 are views showing address decoding operations of a synonym address decoder 160 shown in FIG. 1. Because respective addresses of the data cache 110 should be decoded by means of different addresses, an on-chip memory 140 larger than the data cache 110 to be tested is needed. In contrast, in the present invention, a plurality of addresses of the data cache 110 are decoded through one address of the on-chip memory 140 for every predetermined address. Namely, the synonym address decoder 160 of the present invention decodes respective addresses of the data cache 110 without regard for predetermined bits included in each tag field of the addresses so that the plurality of addresses of the data cache 110 are mapped to one address of the on-chip memory 140 for every predetermined address.

For example, when 8 "don't care" address bits are included in a 32 bit address, as indicated in the following Table 1, one address value of the on-chip memory 140 is decoded every $2^8$ addresses. Addresses of Table 1 indicate a part of address decoding results having 8 "don't care" address bits.

TABLE 1

| Data cache address | On-chip memory address |
|---|---|
| F000–0000 | F000–0000 |
| F000–0001 | F000–0000 |
| . . . | . . . |
| F000–0010 | F000–0000 |
| . . . | . . . |
| F000–00FF | F000–0000 |
| F000–0100 | F000–0100 |
| F000–0101 | F000–0100 |
| . . . | . . . |
| F000–01FF | F000–0100 |

Conventionally, addresses of the data cache 110 are decoded by different addresses of the on-chip memory 140. However, in the present invention, as indicated in Table 1 above, a plurality of addresses of the data cache 110 are decoded by one address of the on-chip memory 140. As explained in greater detail below by reference to FIGS. 7 and 8, in the present invention, the read-miss, write-miss, line fill, and cast out operations are all tested by means of the addresses decoded by the method of Table 1.

Decoding the plurality of addresses of the data cache 110 is referred to as a synonym decoding. "Don't care" address bits are referred to as synonym address bits. An address obtained by the synonym address decoding is referred to as a synonym address. An address area having the synonym address is referred to as a synonym address area.

FIG. 4 shows an on-chip memory 140 having an address area of $2^{(s+b)}$ bytes corresponding to a single set size, and a synonym address area of the on-chip memory 140 necessary to test the data cache 110 having an address area of $2^{(n+s+b)}$ bytes.

In FIG. 4, to map an address area of 2N set size to the on-chip memory 140 having an address area of one set size, a synonym address decoder 160 should have a total of n+1 synonym address bits. For example, when a size of the on-chip memory 140 for testing the ARM1020E data cache is a single set size of 512 bytes, the synonym address decoder 160 should have address decoding results that allow an address area of 128 set size (being twice of 64 sets, namely $2^{(n+1)}=2^7=128$) to be mapped to the on-chip memory 140 of one set size.

In the case of the ARM1020E data cache, since a value of the n parameter is 6, the synonym address decoder 160 performs an address decoding without regard to synonym address bits of 8 bits corresponding to n+1. As a result, as shown in FIG. 4, an address of $2^{(n+s+b+1)}$ bytes can be mapped to the on-chip memory 140 having a physical address area of $2^{(s+b)}$. Since the synonym decoder 160 has synonym address bits having a total of n+1 bits, it is unnecessary to decode the full address of the data cache 110, thereby increasing the decoding speed. When n+1 bits of a tag field are not decoded, a cache miss occurs.

Although the data cache 110 has an address area of N set size, it decodes addresses that allow the on-chip memory 140 to map with a pseudo address area of 2N set size. The synonym address decoder 160 performs testing for a read-miss and a write-miss with respect to the data cache 110 having an address of N set size. The description will be given by reference to FIGS. 7 and 8 below.

FIG. 5 shows the on-chip memory 140 having an address area of $2^b$ bytes corresponding to a single block size and a synonym address area necessary to test the data cache 110. To map an address of $2^{(n+s+1)}$ block size to an address area of one block size, the synonym address decoder 160 should have synonym address bits having a total of n+1 bits.

For example, when the on-chip memory 140 for testing the ARM1020E data cache is a single block size of 32 bits in size, it should have an address decoding result that allows an address area 2048 block size (twice of 1024, namely, $2^{(n+s+1)}=2^{11}2048$) to be mapped to the on-chip memory 140 having an address area of one block size. For the ARM1020E data cache, because a value of the n parameter is 6 and a value of the s parameter is 4, the synonym address decoder 160 carries out address decoding without regard for an address of 11 bits corresponding to n+s+1. Consequently, as shown in FIG. 5, the data cache 110 having an address area of $2^{(n+s+1)}$ bytes can be tested by the on-chip memory 140 having a physical address area of $2^b$ bytes. Further, when n+1 bits of a tag field and s bits of a set index are not decoded, a cache-miss occurs.

As described above, the on-chip memory 140 includes synonym address bits having a total of n+1 bits when it has an address area of $2^{(s+b)}$ bytes corresponding to a single set size, whereas the on-chip memory 140 includes synonym address bits having a total of n+s+1 bits when it has an address area of $2^b$ bytes corresponding to a single set size. That is, the smaller the size of the on-chip memory 140 is, the larger the size of the synonym address bit is. As shown in FIG. 5, when the on-chip memory 140 has a minimum memory size (namely, a single block size), a size of the synonym address is determined as follows.

Figure 6:
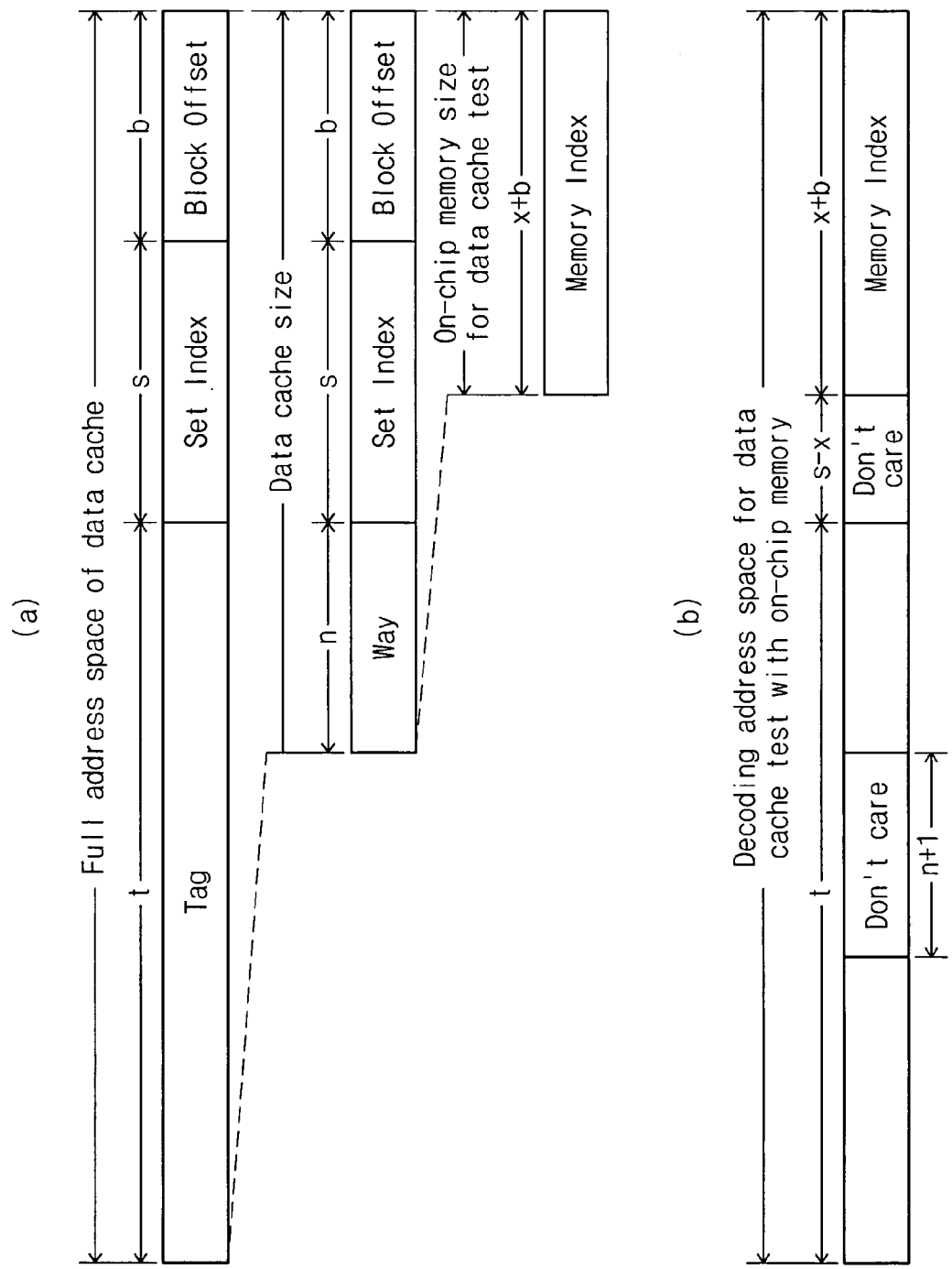
FIG. 6 is a view showing a synonym address area with respect to an on-chip memory having a minimum memory size.

FIG. 6 is a view showing a synonym address area with respect to an on-chip memory 140 having a minimum memory size. FIG. 6(a) shows a full address area of the data cache 110, a size of the data cache 110, and a size of the on-chip memory 140 used to test the data cache 110. FIG. 6(b) shows a synonym address area and a decoding address area necessary for testing the data cache 100 by the on-chip memory 140 having a size smaller than that of the data cache 110.

With reference to FIG. 6, it is understood that a sum of a size ADD_SIZE$_{SYNONYM}$ and a size ADD_SIZE$_{ON\text{-}CHIP}$ of an address area of the on-chip memory 140 is designed to be greater than a size ADD_SIZE$_{D\text{-}CACHE}$ of an address area of the data cache 110 as shown in the following equation 1.

$$\text{ADD\_SIZE}_{D\text{-}CACHE} < \text{ADD\_SIZE}_{SYNONYM} + \text{ADD\_SIZE}_{ON\text{-}CHIP} \quad (1)$$

That is, in the present invention, since ADD_SIZE$_{D\text{-}CACHE}$ of the address area of the data cache 110 is $2^{n+s+b}$ bytes, address decoding is performed so that a sum of the size ADD_SIZE$_{SYNONYM}$ of the synonym address area and the size ADD_SIZE$_{ON\text{-}CHIP}$ of an address area of the on-chip memory 140 becomes greater than $2^{n+s+b+1}$ [where, n+s+b+1={(n+1)+(s-x)}+(x+b)] bytes.

For example, to test the ARM102E data cache using the on-chip memory 140 having a single block size (namely, 32 bytes) corresponding to a minimum memory size, it should be possible to map an address area of 2048 block size being twice of 1024 blocks (namely, $2^{(n+s+1)}2^{11}=2048$) to the on-chip memory 140 having an address area of one block size. Accordingly, as indicated in the equation 1, when the address decoding is carried out by using synonym address bits of 11 bits corresponding to n+s+1, as shown in FIG. 5, the on-chip memory 140 having a physical address area of $2^b$ bytes operates like the on-chip memory 140 having an address area of $2^{(n+s+b+1)}$ bytes. Accordingly, the on-chip memory 140 of a small size can sufficiently test a data cache 100 having a size greater than that of the on-chip memory 140.

Figure 7:
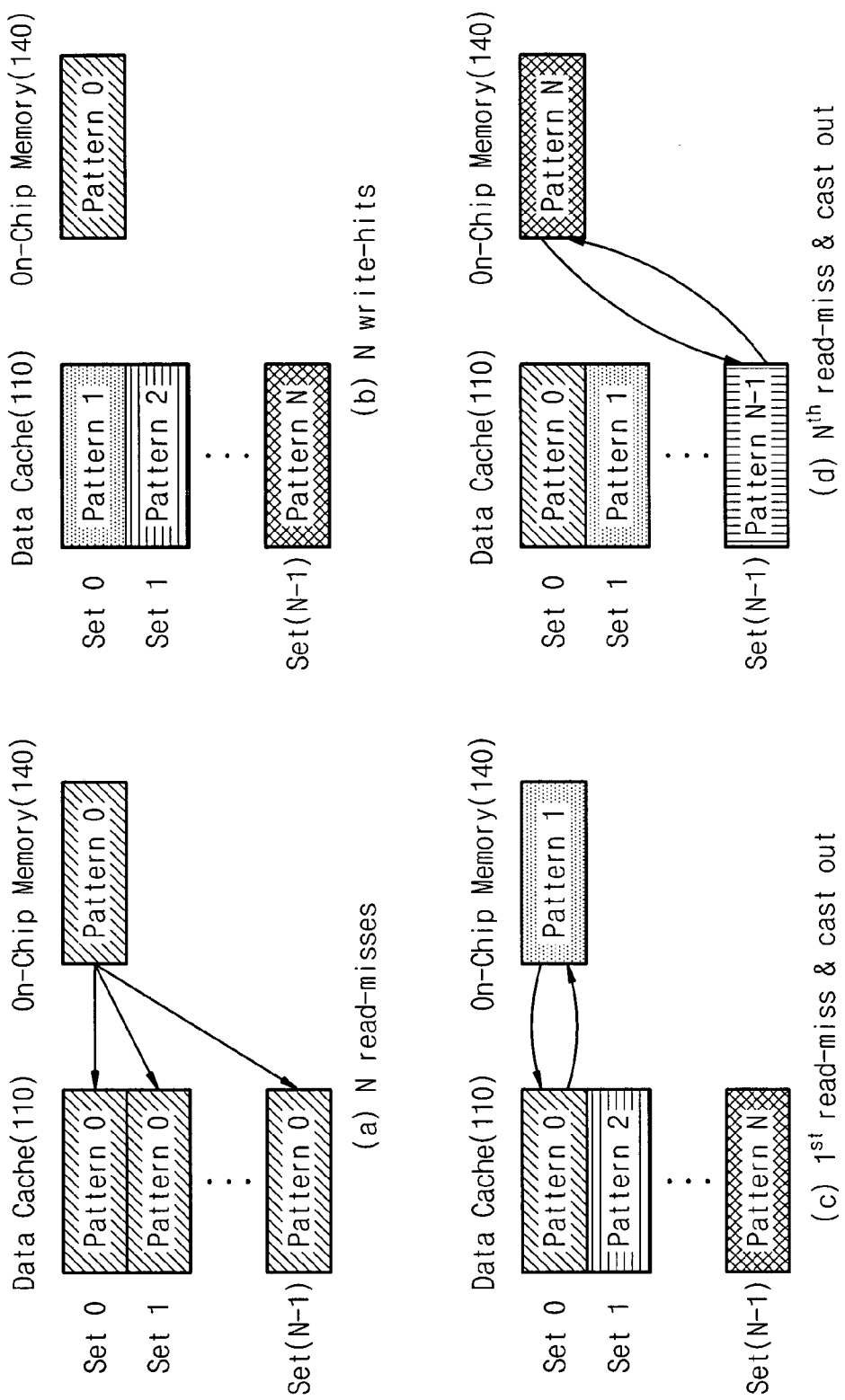
FIG. 7 is a view showing an at speed test method of a data cache according to an embodiment of the present invention.
Figure 8:
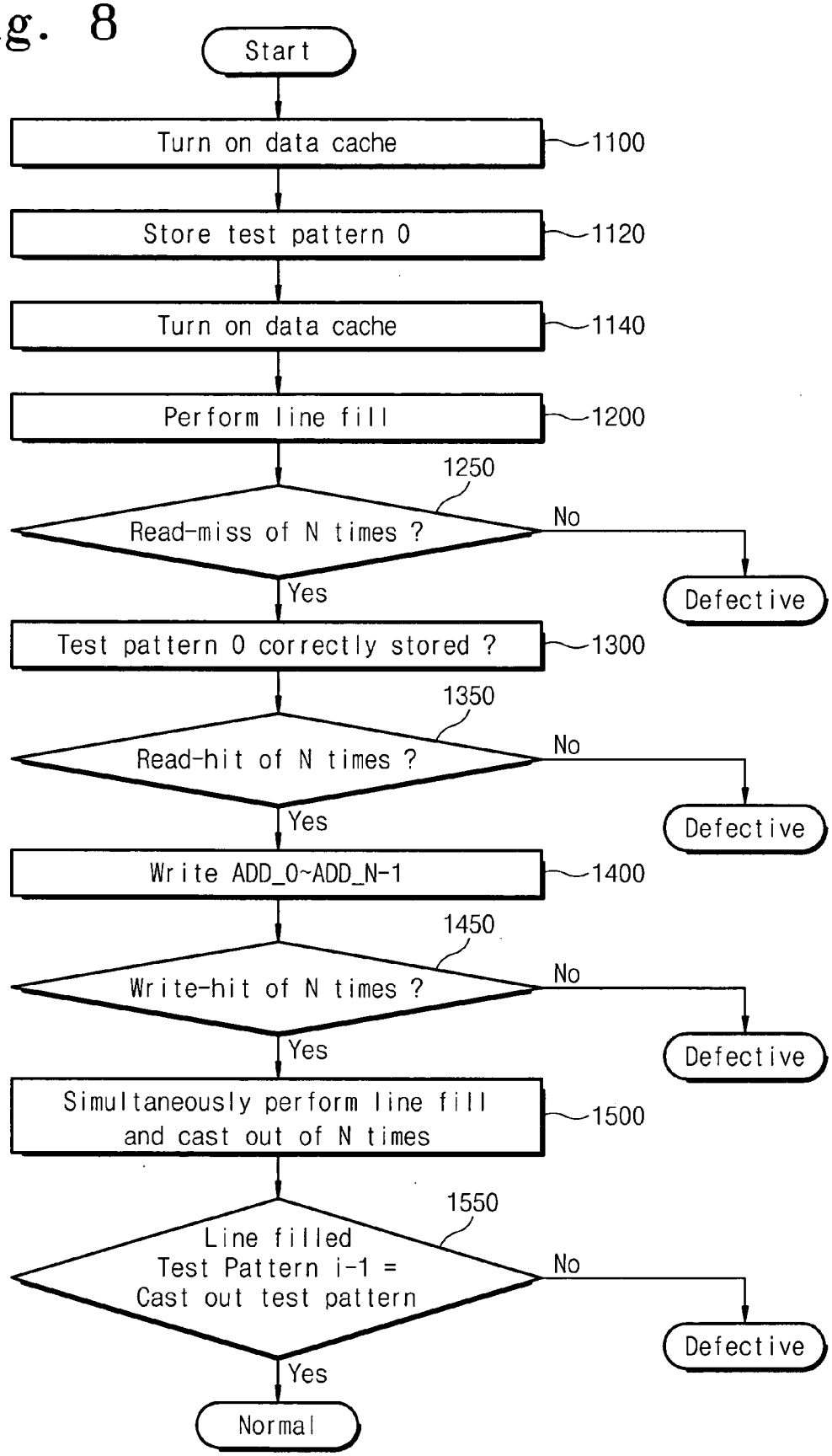
FIG. 8 is a flow chart showing an at speed test method of a data cache according to an embodiment of the present invention.

FIG. 7 is a view showing an at speed test method of a data cache according to an embodiment of the present invention, and FIG. 8 is a flow chart showing an at speed test method of a data cache according to an embodiment of the present invention. In other words, FIG. 7 and FIG. 8 show the at speed test method for the on-chip memory 140 having a single set size.

Referring to FIG. 7 and FIG. 8, the at speed test method of a data cache according to the present invention turns off the data cache 100 (step 1100) prior to testing. Then, a test pattern 0 is stored in the on-chip memory 140 (step 1120). Next, the data cache 110 is turned on (step 1140). Thereafter, when a read-miss occurs in the data cache 110, as shown in FIG. 7(a), N addresses ADD_0~ADD_N-1 of the data cache 110 are read from a corresponding synonym address area. A line fill, storing a test pattern 0 in a corresponding address of the on-chip memory 140 that the N addresses ADD_0~ADD_N-1 designate, is performed (step 1200). It is determined whether a read-miss of N times is performed, that is, whether a read operation of test pattern 0 from the on-chip memory 140 has been performed N times (step 1250).

Based on the result of step 1250, when the read-miss of N times has not been performed, it is determined that a corresponding data cache 110 is defective. On the contrary, when the read-miss of N times has been performed, the N addresses ADD_0~ADD_N-1 stored in the step 1200 are again read. It is determined whether a test pattern 0 is correctly stored in a corresponding address (step 1300). It is determined whether a read-hit has occurred N times based on the result in step 1300 (step 1350).

Based on the result in step S1350, when the read-hit has not occurred N times, it is determined that the corresponding data cache 110 is defective. On the contrary, when the read-hit has occurred N times, as shown in FIG. 7(b), first to N-th test patterns (Pattern 1~Pattern N) having different values are written in the N addresses ADD_0~ADD_N-1 (step 1400). It is determined whether a write-hit of N times has occurred (step 1450). Data obtained by adding and subtracting a predetermined number are used for the first to N-th test patterns (Pattern 1~Pattern N) so that the first to N-th test patterns (Pattern 1~Pattern N) have different values.

Based on the result in step 1450, when the write-hit of N times has not occurred, it is determined that the corresponding data cache 110 is defective. On the contrary, when the write-hit of N times has occurred, as shown in FIG. 7(c) and (d), N addresses ADD_N~ADD_2N-1 of the data cache 110 different from N addresses ADD_0~ADD_N-1 are read from a corresponding synonym address area, and a line fill by addresses and a cast out of N times are simultaneously performed (step 1500). In step 1500, although the N addresses ADD_N~ADD_2N-1 are stored in the same synonym address area as that of the N addresses ADD_0~ADD_N-1 (i.e., mapped to the same address area of the on-chip memory 140 as that of the N addresses ADD_0~ADD_N-1), the N addresses ADD_N~ADD_2N-1 have address values different from those of the N addresses ADD_0~ADD_N-1.

As a result, a set 0 of the data cache 110 is filled with the test pattern 0 stored in the on-chip memory 140, whereas the test pattern 1 is cast out to the on-chip memory 140. Moreover, a set 1 of the data cache 110 is filled with the test pattern 1 stored in the on-chip memory 140, and the test pattern 2 stored in the set 1 is cast out to the on-chip memory 140. That is, every time a read-miss occurs in the data cache 110, a test pattern i-1 is line-filled, and a test pattern i is cast-out. It is determined whether the line-filled test pattern i-1 corresponds to the cast-out test pattern i in the N addresses ADD_N~ADD_2N-1 in step 1550.

Based on the result in step 1550, when the line-filled test pattern i-1 does not correspond to the cast-out test pattern i, it is determined that a corresponding data cache is defective. When the line-filled test pattern i-1 corresponds to the cast-out test pattern i, it is determined that a corresponding data cache is normal. Assuming that the data cache 110 used for testing is a write-back cache, and the contents of a line fill take precedence over a cast out of a corrected dirty copy when a read-miss occurs, the aforementioned at speed test method is performed.

As described above, in the at speed test method of the data cache 110 according to the present invention, when the data cache 110 has N address areas, 2N address areas are decoded to an address area of the on-chip memory 140. By using the N addresses ADD_0~ADD_N−1, a read-miss of N times and a write-miss of N times for the data cache 110 are tested, whereas by using residual N addresses ADD_N ADD_2N−1, line fill and cast out operations for the data cache 110 are carried out.

Conventionally, respective addresses of a data cache are decoded to different addresses of an on-chip memory. In contrast, a plurality of addresses of the data cache are decoded to one address of the on-chip memory for every predetermined address. Furthermore, read-miss, writer-miss, line fill, and cast out operations of entire address areas of the data cache may be all tested using the decoded addresses. Therefore, the speed testing operation for a data cache included in the semiconductor integrated circuit is sufficiently performed by means of an on-chip memory having a smaller size as compared with a size of the data cache.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

The present invention provides a recording medium is readable by a computer, which can be embodied by codes that are able to be read by a computer. The recording medium that the computer can read includes all kinds of recording devices in which data being readable by a computer system are stored. There are ROM, RAM, CD-ROM, magnetic tape, floppy disc, and optical data storage device and the like as examples of the recording medium. In addition to this, the recording medium has devices that are embodied in a carrier wave (transmission through internet). The recording medium is dispersed into a computer system connected to a network. Codes that the computer system can read are stored in the recording medium and the recording medium is executed by the stored codes.

What is claimed is:

1. A semiconductor integrated circuit comprising:
a data cache having a first data storage area;
an on-chip memory having a second data storage area smaller than the first data storage area, the on-chip memory for storing test data; and
an address decoder for decoding addresses so that the first data storage area is mapped to the second data storage area when an access for the test data stored in the on-chip memory is required.

2. The semiconductor integrated circuit as set forth in claim 1, wherein the address decoder decodes addresses so that 2N (where, N is an integer number) addresses are mapped to the second data storage area of the on-chip memory when the data cache has the first data storage area corresponding to N addresses.

3. The semiconductor integrated circuit as set forth in claim 1, wherein the address decoder assigns at least one bit among address bits of the data cache to don't care address bits that do not influence the address decoding.

4. The semiconductor integrated circuit as set forth in claim 3, wherein the address decoder assigns n+1 bits to the don't care address bits when the data cache has $2^n$ sets, each of the $2^n$ sets has $2^s$ blocks, one cache block size is $2^b$ bytes, an entire cache size $2^{(s+b+n)}$, and the on-chip memory has an address area of $2^{(s+b)}$ bytes corresponding to a single set size.

5. The semiconductor integrated circuit as set forth in claim 3, wherein the address decoder assigns n+s+1 bits to the don't care address bits when the data cache has $2^n$ sets, each of the $2^n$ sets has $2^s$ blocks, one cache block size is $2^b$ bytes, an entire cache size is $2^{(s+b+n)}$, and the on-chip memory has an address area of $2^b$ bytes corresponding to a single block size.

6. The semiconductor integrated circuit as set forth in claim 5, wherein the smaller an address area of the on-chip memory becomes, the greater the number of the don't care address bits becomes.

7. The semiconductor integrated circuit as set forth in claim 6, wherein the number of the don't care address bits is determined so that a sum of a size of an address decoded by the address decoder and a size of an address area of the on-chip memory is greater than a size of an address area of the data cache.

8. An at speed test system comprising:
a semiconductor integrated circuit for decoding addresses so that a data storage area of a data cache is mapped to an on-chip memory having a data storage area smaller than the data storage area of the data cache, and for performing a read-miss operation, a line-fill operation, and a cast out operation for the decoded addresses of the data cache using test data stored in the on-chip memory; and
a test circuit for receiving operation execution results of the data cache from outside of the semiconductor integrated circuit, and for testing whether the data cache is defective based on the received operation execution results of the data cache.

9. The at speed test system as set forth in claim 8, wherein the semiconductor integrated circuit for
(a) reading first test data stored in the on-chip memory,
(b) performing a line fill of N times for N different addresses of the data cache,
(c) writing second test data having different values in the N different addresses of the data cache,
(d) performing a line fill that reads the first test data stored in the on-chip memory and stores new second test data in a corresponding address of the data cache, with respect to N addresses having values different from those of the N different addresses of the data cache, and
(e) casting out second test data previously stored in the corresponding address of the data cache while performing the line fill of step (d) for storing new first test data in the on-chip memory.

10. The at speed test system as set forth in claim 9, wherein the N different addresses in step (c), and the N addresses used in step (d) are mapped to the same address area of the on-chip memory.

11. The at speed test system as set forth in claim 9, wherein line filled data used for an i-th address among the N addresses are identical to cast out data generated in an i−1)-th address among the N addresses.

12. A method for at speed testing a data cache using an on-chip memory of a semiconductor integrated circuit, the method comprising the steps of:
(a) decoding an address area of the data cache to an address area of the on-chip memory smaller than the address area of the data cache; and
(b) reading test data from the on-chip memory in response to the decoded address area and testing a read-miss, a write-miss, a line fill, and a cast out of the data cache.

13. The method as set forth in claim 12, wherein step (a) decodes 2N addresses to an address area of the on-chip memory when the data cache has N addresses.

14. The method as set forth in claim 12, wherein step (a) assigns at least one bit among address bits of the data cache to don't care address bits that do not influence the address decoding.

15. The method as set forth in claim 14, wherein step (a) assigns n+1 bits to the don't care address bits when the data cache has $2^n$ sets, each of the $2^n$ sets has $2^s$ blocks, one cache block size is $2^b$ bytes, an entire cache size is $2^{(s+b+n)}$, and the on-chip memory has an address area of $2^{(s+b)}$ bytes corresponding to a single set size.

16. The method as set forth in claim 14, wherein step (a) assigns n+s+1 bits to the don't care address bits when the data cache has $2^n$ sets, each of the $2^n$ sets has $2^s$ blocks, one cache block size is $2^b$ bytes, an entire cache size is $2^{(s+b+n)}$ and the on-chip memory has an address area of $2^b$ bytes corresponding to a single block size.

17. The method as set forth in claim 16, wherein the smaller an address area of the on-chip memory becomes, the greater the number of the don't care address bits becomes.

18. The method as set forth in claim 17, wherein the number of the don't care address bits is determined so that a sum of a size of an address decoded in step (a) and a size of an address area of the on-chip memory is greater than a size of an address area of the data cache.

19. The method as set forth in claim 12, wherein step (b) comprises:
 (b-1) reading first test data stored in the on-chip memory, performing a line fill of N times for N different addresses of the data cache, and determining whether defects in the line fill operation occur;
 (b-2) writing second test data having different values in the N different addresses of the data cache to determine whether defects in the write operation occur;
 (b-3) performing a line fill reading the first test data stored in the on-chip memory and storing new second test data in a corresponding address of the data cache with respect to N addresses having values different from those of the N addresses of the data cache; and
 (b-4) casting out the second test data previously stored in the corresponding address of the data cache and storing the cast-out data in the on-chip memory as the new first test data while performing the line fill, and determining whether defects in the line fill and casting out operations occur.

20. The method as set forth in claim 19, further comprising the steps of:
 (b-1-1) turning off the data cache;
 (b-1-2) storing the first test data in the on-chip memory; and
 (b-1-3) turning on the data cache, before performing step (b-1).

21. The method as set forth in claim 19, wherein N addresses identical with the N addresses used in steps (b-1) and (b-2) and mapped to an address area of the-on-chip memory are used in step (b-3).

22. The method as set forth in claim 19, wherein line fill data used for an i-th address among the N addresses are identical to cast out data generated in an (i−1)-th address among the N addresses.

23. A method for at-speed-testing a data cache using an on-chip memory of a semiconductor integrated circuit, the method comprising the steps of:
 (a) decoding an address area of the data cache to an address area of the on-chip memory smaller than the address area of the data cache;
 (b) reading test data from the on-chip memory in response to the decoded address area, executing read-miss, write-miss, line fill, and cast out operations of the data cache, and outputting the executed results to an external tester of the semiconductor integrated circuit; and
 (c) analyzing operation execution results of the data cache by the tester and determining whether the data cache is defective.

24. The method as set forth in claim 23, wherein step (b) comprises:
 (b-1) reading first test data stored in the on-chip memory and performing a line fill of N times for N different addresses of the data cache;
 (b-2) writing second test data having different values in the N different addresses of the data cache to determine whether defects in the write operation occur;
 (b-3) performing a line fill reading the first test data stored in the on-chip memory and storing new second test data in a corresponding address of the data cache with respect to N addresses having values different from those of the N different addresses of the data cache; and
 (b-4) casting out second test data previously stored in the corresponding address of the data cache, and storing the cast-out data in the on-chip memory as the new first test data while performing the line fill.

25. The method as set forth in claim 24, wherein the N different addresses in step (b-2), and the N addresses used step (b-3) are mapped to the same address area of the on-chip memory.

26. The method as set forth in claim 24, wherein line fill data used for an i-th address among the N addresses are identical to cast out data generated in an (i−1)-th address among the N addresses.

* * * * *